(12) United States Patent
Jia et al.

(10) Patent No.: US 12,301,289 B1
(45) Date of Patent: May 13, 2025

(54) SYSTEMS AND METHODS FOR FREE SPACE OPTICAL INJECTION LOCKING

(71) Applicant: CABLE TELEVISION LABORATORIES, INC., Louisville, CO (US)

(72) Inventors: Zhensheng Jia, Superior, CO (US); Luis Alberto Campos, Superior, CO (US); Haipeng Zhang, Broomfield, CO (US); Mu Xu, Broomfield, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 99 days.

(21) Appl. No.: 18/098,624

(22) Filed: Jan. 18, 2023

Related U.S. Application Data

(63) Continuation-in-part of application No. 17/703,886, filed on Mar. 24, 2022.
(Continued)

(51) Int. Cl.
| | |
|---|---|
| *H04B 10/11* | (2013.01) |
| *H01S 5/40* | (2006.01) |
| *H04B 10/112* | (2013.01) |
| *H04B 10/114* | (2013.01) |
| *H04B 10/40* | (2013.01) |

(Continued)

(52) U.S. Cl.
CPC .......... *H04B 10/40* (2013.01); *H01S 5/4006* (2013.01); *H04B 10/11* (2013.01); *H04B 10/1123* (2013.01); *H04B 10/1143* (2013.01); *H04B 10/504* (2013.01); *H04B 10/506* (2013.01); *H04B 10/532* (2013.01);
(Continued)

(58) Field of Classification Search
CPC .......... H04B 10/11–118; H01S 5/34353; H01S 5/4006
USPC .................................................. 398/115–131
See application file for complete search history.

(56) References Cited

U.S. PATENT DOCUMENTS

| | | |
|---|---|---|
| 4,677,629 A | 6/1987 | Lesh |
| 4,755,016 A | 7/1988 | DeLoach, Jr. et al. |

(Continued)

FOREIGN PATENT DOCUMENTS

| | | | | |
|---|---|---|---|---|
| WO | WO-0232020 A1 | * | 4/2002 | ......... H04B 10/1121 |
| WO | 2019122369 A1 | | 6/2019 | |
| WO | 2021224485 A1 | | 11/2021 | |

OTHER PUBLICATIONS

Zhang et al: "Fiber-wireless integrated mobile backhaul network based on a hybrid millimeter-wave and free-space-optics architecture with an adaptive diversity combining technique", Optics Letter, vol. 41, No. 9, May 1, 2016, pp. 1909-1912 (Year: 2016).*
(Continued)

*Primary Examiner* — Li Liu
(74) *Attorney, Agent, or Firm* — Josh C. Snider; Snider IP

(57) ABSTRACT

An optical emission array includes an optical input portion configured to provide a parent laser source for the optical emission array, and an optical output portion including a plurality of child laser emitters. Each child laser emitter of the plurality of child laser emitters is injection-locked to the parent laser source. The optical emission array further includes at least two optical distribution branches (i) disposed between the optical input portion and the optical output portion, and (ii) optically connecting at least two child laser emitters of the plurality of child laser emitters, respectively, to the parent laser source.

12 Claims, 7 Drawing Sheets

Related U.S. Application Data

(60) Provisional application No. 63/300,327, filed on Jan. 18, 2022, provisional application No. 63/140,883, filed on Jan. 24, 2021.

(51) Int. Cl.
   *H04B 10/50* (2013.01)
   *H04B 10/532* (2013.01)
   *H04B 10/61* (2013.01)
   *H04B 10/63* (2013.01)

(52) U.S. Cl.
   CPC ........... *H04B 10/615* (2013.01); *H04B 10/63* (2013.01); *H04B 2210/006* (2013.01)

(56) References Cited

U.S. PATENT DOCUMENTS

| | | | |
|---|---|---|---|
| 5,379,309 A * | 1/1995 | Logan, Jr. | H01S 5/4006 372/18 |
| 7,627,249 B1 * | 12/2009 | Izadpanah | H04B 10/1121 398/115 |
| 8,615,028 B1 | 12/2013 | Sayyah et al. | |
| 9,880,351 B2 | 1/2018 | Chien et al. | |
| 10,613,410 B2 | 4/2020 | Hosseini et al. | |
| 10,944,478 B2 | 3/2021 | Zhang et al. | |
| 11,112,310 B2 | 9/2021 | Anandarajah et al. | |
| 11,418,263 B2 | 8/2022 | Zhang et al. | |
| 2001/0004290 A1 | 6/2001 | Lee et al. | |
| 2002/0122230 A1 * | 9/2002 | Izadpanah | H04B 10/1121 398/118 |
| 2003/0103534 A1 | 6/2003 | Braiman et al. | |
| 2004/0101317 A1 | 5/2004 | Yap et al. | |
| 2004/0146296 A1 * | 7/2004 | Gerszberg | H04B 10/1123 398/12 |
| 2004/0264977 A1 * | 12/2004 | Yap | G02F 2/02 398/161 |
| 2006/0114955 A1 | 6/2006 | Steckman | |
| 2006/0239312 A1 | 10/2006 | Kewitsch et al. | |
| 2006/0280209 A1 | 12/2006 | Treusch et al. | |
| 2007/0002925 A1 | 1/2007 | Zediker et al. | |
| 2009/0180502 A1 | 7/2009 | Byun et al. | |
| 2010/0046003 A1 | 2/2010 | Le Floch et al. | |
| 2010/0303111 A1 | 12/2010 | Kupershmidt | |
| 2011/0052114 A1 | 3/2011 | Bernasconi et al. | |
| 2011/0142451 A1 * | 6/2011 | Shi | H04B 1/40 398/115 |
| 2011/0150502 A1 | 6/2011 | Zhao et al. | |
| 2011/0304853 A1 | 12/2011 | Yamada et al. | |
| 2012/0251129 A1 | 10/2012 | Delfyett et al. | |
| 2014/0177661 A1 | 6/2014 | Tanaka et al. | |
| 2014/0314368 A1 | 10/2014 | Chien et al. | |
| 2018/0191428 A1 * | 7/2018 | Hemmati | H04B 10/1125 |
| 2018/0269972 A1 * | 9/2018 | Djordjevic | H04B 10/25752 |
| 2019/0326995 A1 | 10/2019 | Zhou et al. | |
| 2019/0393962 A1 | 12/2019 | Zhang et al. | |
| 2021/0036484 A1 | 2/2021 | Maker et al. | |
| 2022/0057641 A1 | 2/2022 | Hoefler et al. | |

OTHER PUBLICATIONS

Althunibat et al: "A hybrid free space optical-millimeter wave cooperative system", Optics Communications, vol. 453, (2019) 124400, Aug. 17, 2019, pp. 1-11 (Year: 2019).*

Dat et al: "Hybrid FSO/MMW system for high-speed and reliable mobile fronthaul system", ECOC 2019, Sep. 22-26, 2019, pp. 1-4 (Year: 2019).*

McKenna et al: "Hybrid Millimeter-Wave/Free-Space Optical System for High Data Rate Communications", 2013 IEEE Photonics Conference (IPC), paper TuC3.2 (Year: 2013).*

Zhao et al: "Hybrid FSO/MMW Communication System with Active Link Switching based on Weather Conditions", 2021 Asia Communications and Photonics Conference (ACP), Oct. 24-27, 2021 (Year: 2021).*

Touati et al: "On the Effects of Combined Atmospheric Fading and Misalignment on the Hybrid FSO/RF Transmission", J. Opt. Commun. Netw, vol. 8, No. 10, Oct. 2016, pp. 715-725 (Year: 2016).*

* cited by examiner

SYSTEMS AND METHODS FOR FREE SPACE OPTICAL INJECTION LOCKING

CROSS REFERENCE TO RELATED APPLICATIONS

This application is a continuation in part of U.S. patent application Ser. No. 17/703,886, filed Mar. 24, 2022, which claims the benefit of and priority to U.S. Provisional Application No. 63/140,883, filed Jan. 24, 2021. This application also claims the benefit of and priority to U.S. Provisional Application No. 63/300,327, filed Jan. 18, 2022. The subject matter from all of these applications are incorporated herein by reference in their entireties.

BACKGROUND

The field of the disclosure relates generally to optical communication networks, and more particularly, to optical networks utilizing optical injection locking techniques.

Some conventional point-to-point (P2P) telecommunication networks include two transceivers at opposing ends of a "wired" communication line (e.g., fiber, coaxial, hybrid fiber-coaxial (HFC), etc.). Conventional point-to-multipoint (P2MP) telecommunication networks often include a service provider hub or headend to which a plurality of end user subscribers connect. Bandwidth requirements for delivering high-speed data and video services through such networks are rapidly increasing to meet growing consumer demands. Many such conventional networks are now based on passive optical network (PON) technologies, which have become a dominant system architecture to meet the growing high capacity demand from P2P and P2MP end users.

Some conventional optical communication systems implement free space optics (FSO) in place of at least some of the "wired" transport media of the system. That is, different from many legacy wired networks, in an FSO communication system, free space and/or air acts as the medium between an opposing optical transmitter and optical receiver, which should be in a line of sight of one another for successful transmission of the optical signal. Such a conventional FSO solution is described further below with respect to FIG. 1. It should be noted that, although FSO transport is sometimes referred to as "wireless" transport, FSO transport is entirely optical between respective transmitters and receivers, and should be differentiated from conventional electromagnetic radio frequency (RF) wireless communications over RF bands (e.g., Wi-Fi, long term evolution (LTE), etc.).

FIG. 1 is a schematic illustration depicting a conventional FSO transmission scheme 100 for one-way optical transmission over an FSO communication medium 102. Scheme 100 includes an optical transmitter 104 and an optical receiver 106 disposed across FSO communication medium 102, and within line of sight of one another. FSO system communications according to scheme 100 utilize modulated optical and/or laser beams to send telecommunication information through the atmosphere of FSO communication medium 102.

More particularly, optical transmitter 104 includes a transmitting optical source 108 (e.g., a laser diode) in communication with a modulator 110, which modulates an electrical signal input 112 (e.g., a data signal) onto the optical/laser beam from transmitting optical source 108. An optical output portion 114 (e.g., optical coupler, passive optical elements, etc.) then transmits the modulated beam from modulator 110 then across FSO communication medium 102 to optical receiver 106. At optical receiver 106, the modulated beam is received at an optical input portion 116 (e.g., optical coupler, passive optical elements, etc.), which feeds the received modulated beam to a photodetector 118, which converts the received modulated beam into a received electrical signal. The received electrical signal is amplified by an amplifier 120 (e.g., a transimpedance amplifier, or TIA), which produces an electrical signal output 122.

For ease of explanation, scheme 100 is depicted with respect to one-way communication across FSO communication medium 102. Where bidirectional capability is desired, at least one optical transceiver may be disposed at each end of communication medium 102. Respective transmitting and receiving portions of such conventional optical transceivers operate according to the general principles described with respect to scheme 100.

However, conventional FSO solutions that utilize this single-transmitter and single-aperture receiver architecture are known to realize a significant probability of deep fades. To reduce the deep fade probability, and also to improve emission and detection efficiency, multiple transmitters and receivers have been recently proposed in an array. Such array-based proposals are of particular interest with respect to newer coherent optics technologies since, in a coherent optic system, an inherent coherent gain is realized when the spatial field of the received signal matches that of the local oscillator (LO), thereby providing improved background noise rejection, as well as spatial and frequency selectivity.

However, the laser source remains one of the highest-cost elements in coherent optical transceiver structure, which has rendered such recent array-based FSO proposals cost-prohibitive for practical implementation. Typical coherent optics communication systems use an external cavity laser (ECL), which generate a relatively narrower linewidth (e.g., approximately 50-500 kHz in range) for coherent system needs. An ECL has a reflector that creates a cavity outside of a gain chip, thereby enabling the cavity to have an effectively greater length than if confined to the gain chip. By adding this external cavity to the gain medium semiconductor structure of the chip, a very fine single-frequency linewidth emission condition may be imposed. Nevertheless, ECL implementation remains very costly, and is particularly complicated for rural FSO applications. In contrast, Fabry-Perot (FP) lasers, or FP laser diodes (FP-LD), are comparatively simple and low-cost light sources. FP lasers, however, are generally confined to lower-data rate applications over short-distance optical communications.

Accordingly, there is a desire in the field to provide lower-cost laser source solutions for FSO communications in both coherent and non-coherent optical systems. Moreover, conventional FSO technologies require both electrical-to-optical (E/O) conversion at the transmission side and optical-to-electrical (O/E) conversion at the receiver side, which significantly increase the hardware complexity to implement FSO, while also reducing the available power. There is thus a further desire to simplify the hardware complexity and maximize available transmission power.

SUMMARY

In an embodiment, an optical emission array includes an optical input portion configured to provide a parent laser source for the optical emission array, and an optical output portion including a plurality of child laser emitters. Each child laser emitter of the plurality of child laser emitters is injection-locked to the parent laser source. The optical emission array further includes at least two optical distribution branches (i) disposed between the optical input portion and the optical output portion, and (ii) optically connecting at least two child laser emitters of the plurality of child laser emitters, respectively, to the parent laser source.

BRIEF DESCRIPTION

These and other features, aspects, and advantages of the present disclosure will become better understood when the following detailed description is read with reference to the accompanying drawings in which like characters represent like parts throughout the drawings, wherein.

Figure 1:
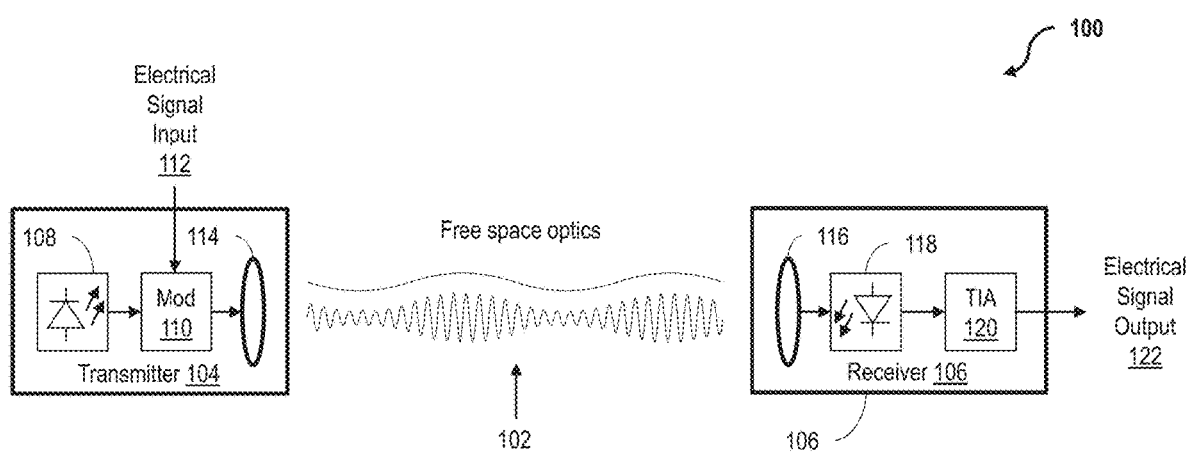
FIG. 1 is a schematic illustration depicting a conventional FSO transmission scheme for one-way optical transmission over an FSO communication medium.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the term "database" may refer to either a body of data, a relational database management system (RDBMS), or to both, and may include a collection of data including hierarchical databases, relational databases, flat file databases, object-relational databases, object oriented databases, and/or another structured collection of records or data that is stored in a computer system.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, servers, and respective processing elements thereof.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

As described herein, "user equipment," or UE, refers to an electronic device or system utilizing a wireless technology protocol, such as Long Term Evolution (LTE) or WiMAX (e.g., IEEE 802.16 protocols), and may include therein Wi-Fi capability to access and implement one or more existing IEEE 802.11 protocols. A UE may be fixed, mobile, or portable, and may include a transceiver or transmitterand-receiver combination. A UE may have separate components, or may be integrated as a single device that includes a media access control (MAC) and physical layer (PHY) interface, both of which may be 802.11-conformant and/or 802.16-conformant to a wireless medium (WM).

As used herein, "modem termination system" (MTS) refers to a termination unit including one or more of an Optical Network Terminal (ONT), an optical line termination (OLT), a network termination unit, a satellite termination unit, a cable modem termination system (CMTS), and/or other termination systems which may be individually or collectively referred to as an MTS.

As used herein, "modem" refers to a modem device, including one or more a cable modem (CM), a satellite modem, an optical network unit (ONU), a DSL unit, etc., which may be individually or collectively referred to as modems.

As used herein, the term "coherent transceiver," unless specified otherwise, refers to a P2P or P2MP coherent optics transceiver having a coherent optics transmitting portion and a coherent optics receiving portion. In some instances, the transceiver may refer to a specific device under test (DUT) for several of the embodiments described herein.

As described herein, a "PON" generally refers to a passive optical network or system having components labeled according to known naming conventions of similar elements that are used in conventional PON systems. For example, an OLT may be implemented at an aggregation point, such as a headend/hub, and multiple ONUs may be disposed and operable at a plurality of end user, customer premises, or subscriber locations. Accordingly, an "uplink transmission" refers to an upstream transmission from an end user to a headend/hub, and a "downlink transmission" refers to a downstream transmission from a headend/hub to the end user, which may be presumed to be generally broadcasting continuously (unless in a power saving mode, or the like).

The person of ordinary skill in the art will understand that the term "wireless," as used herein in the context of optical transmission and communications, including free space optics (FSO), generally refers to the absence of a substantially physical transport medium, such as a wired transport, a coaxial cable, or an optical fiber or fiber optic cable.

As used herein, the term "data center" generally refers to a facility or dedicated physical location used for housing electronic equipment and/or computer systems and associated components, e.g., for communications, data storage, etc. A data center may include numerous redundant or backup components within the infrastructure thereof to provide power, communication, control, and/or security to the multiple components and/or subsystems contained therein. A physical data center may be located within a single housing facility, or may be distributed among a plurality of co-located or interconnected facilities. A 'virtual data center' is a non-tangible abstraction of a physical data center in a software-defined environment, such as software-defined networking (SDN) or software-defined storage (SDS), typically operated using at least one physical server utilizing a hypervisor. A data center may include as many as thousands of physical servers connected by a high-speed network.

As used herein, the term "hyperscale" refers to a computing environment or infrastructure including multiple computing nodes, and having the capability to scale appropriately as increased demand is added to the system, i.e., seamlessly provision infrastructure components and/or add computational, networking, and storage resources to a given node or set of nodes. A hyperscale system, or "hyperscaler" may include hundreds of data centers or more, and may include distributed storage systems. A hyperscale system may utilize redundancy-based protection and/or erasure coding, and may be typically configured to increase background load proportional to an increase in cluster size. A hyperscale node may be a physical node or a virtual node, and multiple virtual nodes may be located on the same physical host. Hyperscale management may be hierarchical, and a "distance" between nodes may be physical or perceptual. A hyperscale datacenter may include several performance optimized datacenters (PODs), and each POD may include multiple racks and hundreds and thousands of compute and/or storage devices."

The following embodiments describe innovative architectures and processes an FSO link using optical injection locking (OIL) technologies that significantly reduce the hardware cost of the optical transceiver, and particularly for coherent optical transmission systems implementing coherent optical injection locking (COIL). The present systems and methods further introduce innovative all-optical array designs which are of particularly value to an FSO coherent link, due to the fact that existing commercially available FSO subsystems are opto-electronic, and thus significantly more costly and complex than the preset purely optical FSO solutions.

In an exemplary embodiment, optical signal processing utilizes OIL techniques to generate a high spectral purity signal from relatively inexpensive laser diode (e.g., FPLDs), thereby enabling low-cost coherent systems based substantially on FP lasers to generate the multiple optical signals transmitted throughout the system. Innovative OIL-based solutions for P2P coherent systems or P2MP coherent systems such as coherent PON (CPON) technologies, have been previously introduced by the present inventors, which significantly increase the receiver sensitivity and overall capacity for WDM-PON access networks, as described in U.S. Pat. No. 9,912,409, the disclosure of which is incorporated by reference herein. These previous solutions provide superior receiver sensitivities, extended power budgets, and high coherent frequency selectivities through innovative techniques that optically injection lock multiple inexpensive, lower-performance lasers (e.g., FPLDs) throughout a network to a single high-performance source laser (e.g., an ECL). The embodiments described below expand upon these earlier solutions by implementing FSO solutions to facilitate optical transport through multiple portions of the optical network.

Figure 2:
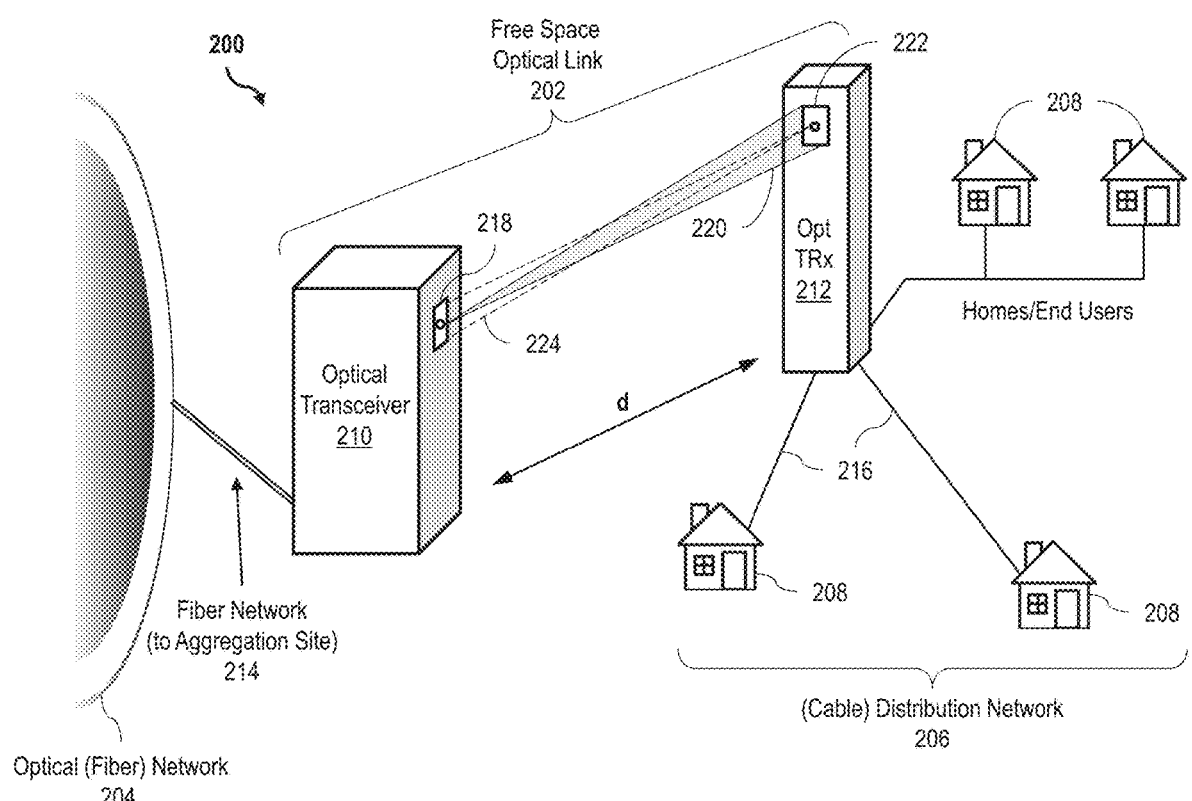
FIG. 2 is a schematic illustration of an exemplary network communication system utilizing a free space optical link.

FIG. 2 is a schematic illustration of an exemplary network communication system 200 utilizing an FSO link 202. In an exemplary embodiment, system 200 includes an optical network 204 disposed upstream of a downstream distribution network 206 in optical communication with optical network 204 through FSO link 202. In the exemplary embodiment depicted in FIG. 2, system 200 is illustrated according to a P2MP configuration, with optical network 204 represented as a fiber network (e.g., having one or more optical hubs (not separately shown)), and distribution network 206 represented as a cable distribution network supporting a plurality of end users 208 (e.g., customer premises, homes, businesses, small cells, etc.). The person of ordinary skill in the art will understand that this particular configuration is provided by way of example, and not in a limiting sense. The FSO principles described with respect to FIG. 2 are also applicable to alternative exemplary configurations of system 200, including without limitation, an access network, a data center, a hyperscaler, a PON/CPON, and/or a hybrid fiber coaxial (HFC) network, without departing from the scope herein.

In an exemplary embodiment, FSO link 202 includes a first optical transceiver 210 in optical communication with a second optical transceiver 212 across a free space distance d. For purposes of this discussion, first optical transceiver 210 may be considered the "upstream transceiver" and second optical transceiver 212 may be considered the "downstream transceiver." These labels though, are relative, and for convenience purposes only. In a bidirectional optical transmission, labels such as "upstream" and "downstream" merely indicate directionality of one transceiver with respect to the other.

In the exemplary embodiment depicted in FIG. 2, upstream transceiver 210 connects to optical network 204 by way of a fiber network 214, which may include at least one "long" optical fiber (e.g., a single mode fiber (SMF) up to 80 km in length), or multiple optical fibers connecting to an aggregation site. In a similar manner, downstream transceiver 212 connects to end users 208 of distribution network 206 by way of one or more "short" fibers 216 (e.g., typically under 5 km in length). In the case where a customer premises equipment (CPE), modem, or ONU (not separately shown) of a particular end user 208 is configured for fiber-to-the-home/premises (ftth/fttp), short fibers may provide a direct optical connection from second optical transceiver 212 to the configured device of that end user 208. In other cases, short fibers may terminate at an intervening fiber node or optical distribution center (ODC) (not shown) servicing the relevant end user 208.

In exemplary operation of system 200, upstream transceiver 210 includes a first optical emitter/detector 218 configured to collect downstream optical signals from fiber network 214, and then transmit, i.e., from an upstream emission portion (not separately illustrated) of first optical emitter/detector 218, a downstream FSO beam 220 to a detector portion (not separately illustrated) of a second optical emitter/detector 222 of downstream transceiver 212 for downstream distribution to respective end users 208. In a similar manner, downstream transceiver 212 is configured to collect upstream signals from end users 208, and then transmit, i.e., from a downstream emission portion (not separately illustrated) of second optical emitter/detector 222, an upstream FSO beam 224 to a detector portion (not separately illustrated) of first optical emitter/detector 218 for upstream delivery to fiber network 214. For purposes of this discussion, it is assumed that a clear line of sight exists between first and second optical emitters/detectors 218, 222.

In an exemplary embodiment, the downstream optical signal obtained from fiber network 214 is a high quality, narrow-band source signal substantially within a single longitudinal mode (e.g., from an ECL) such that downstream FSO beam 220 from upstream transceiver 210 enables emitting lasers (described further below with respect to FIG. 3) of downstream transceiver 212 to injection lock to the frequency of the narrow-band source signal for transmission of upstream FSO beam 224. According to this innovative FSO configuration, OIL may be effectively implemented across the free space of FSO link 202, thereby enabling use of relatively inexpensive (e.g., FP) optical light sources throughout FSO link 202 and system 200 for both upstream and downstream transmission. In a P2MP configuration, the hardware cost reduction may be dramatic, particularly in the case where up to 500 end users may communicate with a single downstream optical transceiver.

Systems and methods according to the innovative techniques of system 200 thus advantageously provide an FSO solution that, from a performance perspective, is comparable to conventional FSO techniques that require high-quality ECL sources across both ends and throughout the conventional FSO link. Due to the high cost of ECLs, such conventional high-quality FSO implementations are typically confined to P2P architectures, which may include as few as two ECLs to complete the FSO link. However, from a cost perspective, system 200 is comparable to conventional FSO systems that utilize all-FP laser sources, except for the additional hardware expense of at least one high-quality (e.g., ECL) parent laser source to which all other laser sources (e.g., as many as 500 in a P2MP optical network) may injection lock thereto as child lasers.

Although relatively inexpensive in comparison to conventional ECL-based FSO systems, the low quality and limited transmission range of conventional all-FP FSO systems have presented significant challenges to the practical utility of their implementation. These conventional challenges have been particularly pronounced with respect to distribution networks including rural geographies, which tend to include much greater numbers of end users separated by significant distances, which in turn renders it cost-prohibitive to lay optical fiber throughout such a rural network. Conventional ECL-based FSO techniques are similarly cost-prohibitive for such geographical scenarios, and conventional all-FP FSO techniques have not provided sufficient quality in these cases. According to the principles of system 200 though, a high quality and cost-effective FSO solution is provided for complex geographical scenarios.

Innovative solutions according to system 200 thus realize still further significant cost savings by eliminating the need for a great quantity of fiber/cable that would conventionally be required to span the distance d across FSO link 202. Additionally, the distance d may be optimally set according to the desired design conditions and operation of system 200. In one exemplary scenario, operational conditions of system 200 may render a shorter distance d (e.g., 1 km) desirable for a high capacity transmission beam, but longer distances d (e.g., 10 km) desirable for lower capacity transmission beams, or even tens of kilometers in the case of satellite transmissions.

Alternatively, as described further below with respect to FIGS. 3-4, operational conditions may render it desirable to implement multiple low-cost child lasers, injection-locked to a single parent source, to transmit a plurality of lower-capacity beams over longer distances d, that deliver an equivalent high-capacity signal in the aggregate. Using the OIL/COIL techniques described above, all of the multiple inexpensive child lasers across FSO link 202 are phase-synchronized to the single high-quality parent source, and thus also to each other, thereby further enabling each such child laser to function as both a transmitting laser source and a local oscillator (LO) source, particularly in the coherent detection implementation case (COIL). Furthermore, because all of the injection-locked signals are phase-synchronized, the need for digital signal processing (DSP) at the respective receiver portions of system 200 is greatly simplified.

The innovative systems and methods described herein are also of particular value for implementations with respect to optical access networks and data centers/hyperscalers. The growing number of global internet users, presently estimated to be over four billion, is driving an ever-increasing demand for bandwidth from existing data center interconnects (DCI) and optical access networks. To meet these high capacity demands, the coherent FSO solutions described herein provide significant advantages to emerging DCI and access network applications due to the superior performance realized thereby in terms of sensitivity and spectral efficiency. However, cost is still a major hurdle for large scale deployments in short-haul networks. As data centers and access networks continue to increase in scale, the present embodiments demonstrate a high-performance, scalable solution to increase the achievable bandwidth, but that does not increase increasing the associated hardware costs in the same proportion as existing conventional solutions.

For example, conventional coherent technology deployments in long-haul optical systems utilize discrete photonic and electronic components considered to be best-in-class. The short-haul optical network paradigm, on the other hand, is a different environment than the long-haul (or metro) optical network paradigm. Conventional optical network costs are primarily driven by the need for separate transmitter lasers and LOs. System 200 significantly reduces such costs by eliminating the need for a separate LO optical source. As also described above, system 200 further reduces the aggregate transmitter laser cost by utilizing injection-locked low-cost transmitter lasers (e.g., FPLDs) in place of all but one of the much more costly ECLs for each transmission source. FPLDs are further with respect to the short-haul environment, due to the less demanding optical link power budget in the short-haul optical network paradigm.

Figure 3:
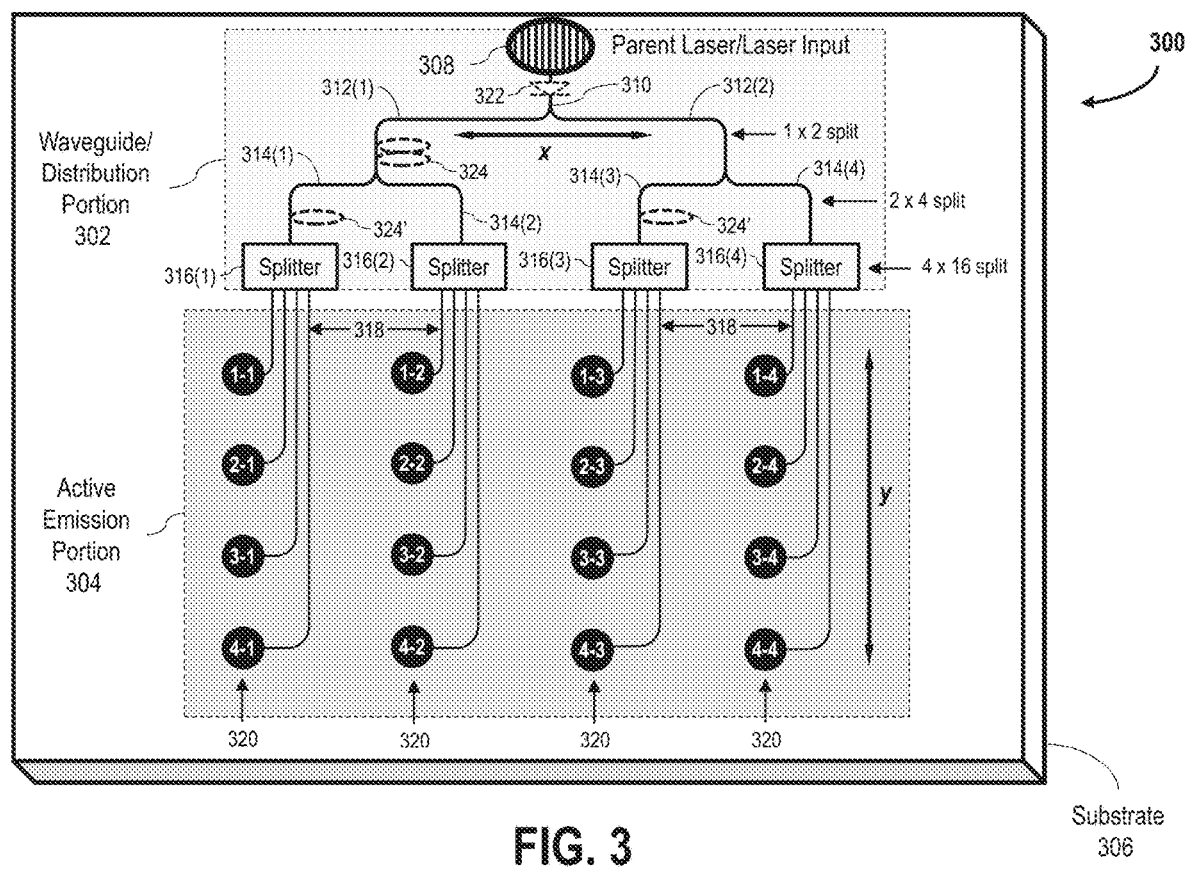
FIG. 3 is a schematic illustration depicting an exemplary optical injection locking laser array.

FIG. 3 is a schematic illustration depicting an exemplary OIL laser array 300. In the exemplary embodiment, array 300 has a generally planar topology, and includes a waveguide distribution portion 302 in optical communication with an active emission portion 304, with both portions 302, 304 formed on a single planar substrate 306. In the exemplary embodiment depicted in FIG. 3, array 300 and substrate 306 may represent a silicon on silica (SoS) single-chip fabrication.

In the exemplary embodiment, waveguide/distribution portion 302 includes a parent laser source 308 (e.g., an ECL) integrated into the chip fabrication. In an alternative embodiment, parent source 308 may represent only an optical input (e.g., an optical coupler) configured to receive a high-quality, narrow-band single longitudinal mode frequency signal from an external high-quality ECL laser source. The high-quality optical signal from parent laser source 308 is then fed into a first primary optical distribution branch 310, which itself is then split into at least two separate secondary optical branches 312(1), 312(2) in a 1×2 optical split. Optionally, each secondary optical distribution branch 312(1), 312(2) may itself be further split into two tertiary optical distribution branches 314 each, namely, a 2×4 optical split of tertiary optical distribution branches 314(1) and 314(2) following secondary optical distribution branch 312(1), and of tertiary optical distribution branches 314(3) and 314(4) following secondary optical distribution branch 312(2).

In an embodiment, each tertiary optical distribution branch 314 feeds into a respective optical splitter 316. In the exemplary embodiment depicted in FIG. 3, each splitter 316 is represented as a four-way splitter configured to separate the optical pathway input from its respective tertiary optical distribution branch 314 into four separate emission branches 318 extending toward active emission portion 304. Each emission branch 318 may then directly provide an optical input into the respective child laser 320 (16 child lasers 320, in this example, labeled 1-1 through 4-4) distributed in an array across active emission portion 304.

The person of ordinary skill in the art will understand that a 1:16 parent-to-child laser ratio, as well as a 4×4 child laser array, is provided by way of example, and is not intended to be limiting. After reading and comprehending the present specification and accompanying drawings, the person of ordinary skill the art will understand that the operational principles of the present techniques may advantageously function using a parent-to-child laser ratio as small as 1:2 (i.e., only two secondary optical distribution branches 312 feeding directly into two respective child lasers 320). Alternatively, the array of child lasers could represent a 1:4 ratio (e.g., a 1×4 or a 2×2 child laser array), a 1:8 ratio, a 1:32 ratio etc., with as many two-way splits and/or four-way splitters as practically necessary to achieve the desired symmetrical array in the x- and/or the y-directions (as shown in FIG. 3).

In an exemplary embodiment, each child laser 320 is fabricated directly on to the SoS structure of the array chip, and includes both a surface-emitting FP laser and a circulator (not separately shown). Conventional surface-emitting FP laser arrays are known in this field of art; however, such conventional FP laser arrays require E/O conversion to produce the respective optical signals from the several FP lasers, and do not provide a high quality (e.g., ECL) parent laser source (e.g., parent laser source 308) on the same array chip (e.g., array 300) to which all FP child lasers 320 may injection lock and phase-synchronize.

In some embodiments, each child laser 320 may optionally include its own modulator (not separately shown) fabricated on the array chip. In other embodiments, at least one modulator is utilized with respect to parent laser source 308, and connected child lasers 320 may simply transmit redundant splits of lower capacity beams from the same parent source, for example, where it may be desirable to transmit multiple low-capacity beams over longer distances instead of single high-capacity beams over shorter distances, as described above.

As also described above, parent laser source 308 may itself be a single high-quality laser source, such as an ECL, or may alternatively represent a passive optical element configured to receive an equivalent high-quality laser signal from an external source. Nevertheless, in both cases, the innovative architecture of array 300 represents an all-optical design topology, having a single high-quality optical source input (i.e., parent laser source 308) and a plurality of injection-locked high-quality optical source outputs (i.e., child lasers 320). This innovative design thus represents a significant improvement over conventional FSO surface-emission arrays, which require electrical source signals and E/O conversion to produce the surface-emission optical outputs. The optical-input/optical-output topology of array 300, on the other hand, represents a lower-complexity architecture that only significantly reduces implementation costs, but also improves performance throughout the entire array.

More particularly, the all-optical topology of array 300 eliminates the need for mechanical beam steering techniques that are often required in conventional FSO transmission schemes. Furthermore, because no E/O conversion is required from input to output, each surface-emitting child laser 320 represents a full transmission emission point, effectively experiencing no significant gain loss from the input of parent laser source 308. Each child laser 320 thus easily transmits at full power, subject only to the power budget of the system/FSO optical link (e.g., system 200/FSO optical link 202, FIG. 2) in which array 300 is deployed (e.g., at first or second optical transceivers 210, 212, FIG. 2).

In one exemplary scenario of the embodiment depicted in FIG. 3, parent laser source 308 may be transmitting (or be received) at +10 dBm optical power. For a 20-dB budget, this parent signal may be split 16 ways (e.g., as illustrated in FIG. 3) or more at one site, and then transmitted over free space to a remote second site with sufficient power budget. In at least one embodiment, an optional amplifier 322 may be disposed after parent laser source 308 to increase the split ratio, the number of child lasers 320 used in the array, and/or the distance d desired for FSO transport.

In some embodiments, array 300 may further include one or more controllable waveguides 324 disposed along one or more of primary optical distribution branch 310, secondary optical distribution branches 312, and/or tertiary optical distribution branches 314. Implementation of this optional component functions to not only provide non-mechanical steering capability for the respective optical signal (e.g., by introducing a phase shift to the respective optical signal on that branch), but also functions to adjust for irregularities that may occur in the fabrication process of array 300. For example, two symmetrical branches from the same split in distribution portion 302 may not be precisely the same length. Implementation of at least one controllable waveguide 324 on one or both branches of that particular split further enables introduction of a delay to the respective optical signal to compensate for mismatches in the branch fabrication lengths.

Controllable waveguides 324 may, for example, include conventional electrical elements, such as a heater pad, to facilitate introduction of phase shifts and/or delays. Nevertheless, it should be noted that such electrical components merely guide the all-optical signals through array 300, and do not perform any E/O or O/E conversion on such signals. Where controllable waveguide 324 is implemented to function as a phase element, it may be desirable to dispose a particular controllable waveguide 324 on a given branch 310, 312, 314 before a particular split within distribution portion 302, such that each subsequent branch stemming from that particular split will be subject to the same effect of that particular phase element. Alternatively, or additionally, a particular controllable waveguide 324 may be disposed on a given branch 312, 314 for individual phase control of that given branch separate from other branches from the same split.

According to the versatile all-optical architecture of array 300, a number of different use cases may be implemented to achieve significant improvements in both the reliability and the data rate of FSO transport. For example, in a first exemplary use case, the plurality of phase-synchronized and wavelength-locked child lasers 320 may be configured to transmit the same high data rate signals (e.g., 10 Gb/s) from each such surface emitter. According to this technique, multiple signal copies may be generated from the several child lasers 320 to provide both redundancy and simplified (i.e., less resource-intensive) joint processing of the received FSO signals.

Alternatively, in a second exemplary use case, the plurality of phase-synchronized and wavelength-locked child lasers 320 may be configured to transmit different low-data rate signals from each such surface emitter. According to this alternative technique, multiple low-data rate tributary signals (e.g., 1 Gb/s) may be generated from the several child lasers 320, which will exhibit significantly higher tolerance of impairments across the FSO link due to the lower data rate, yet nevertheless still provide simplified joint processing due to the phase-synchronization and wavelength-locking. In some instances of this second exemplary use case, the received FSO signals may be easily combined or aggregated to achieve high capacity FSO transport.

In an exemplary embodiment, either exemplary use case described medially above may further advantageously implement coherent detection to realize proved receiver sensitivity. Through such implementation of coherent detection technology, each child laser 320 is enabled to function as both a transmitting laser source and an LO source, thereby eliminating the conventional need for separate source components. Accordingly, in a COIL implementation of array 300, multiple low-cost FP child lasers 320 are each enabled to realize performance quality comparable to the single parent laser 308, and without the need for additional LO hardware. According to this innovative configuration, the increased cost of a single high-quality parent laser 308 may be more easily spread across the multiple high-performing, but low-cost, child lasers 320. Indeed, the individual cost increase to each child laser 320 from the single parent laser 308 is reduced as more child lasers 320 are implemented in array 300. For example, at present, the cost of an ECL is typically at least 100 times greater than the cost of an FPLD.

Thus, in effect, by implementing array 300 into an optical transceiver of an FSO link (e.g., upstream transceiver 210 and/or downstream transceiver 212 of FSO link 202, FIG. 2), after propagation of the resulting FSO beams (e.g., downstream beam 220/upstream beam 224, FIG. 2) through atmospheric turbulence, the optical signals received at each respective receiver aperture may vary randomly over time. However, according to the present embodiments, because all of the individual child laser sources 320 are injection-locked and phase-synchronized to the same parent laser source 308, the received signals may be jointly processed at the respective receiver to easily recover the original transmitted signal. As also described above, in some cases, it may be desirable to disaggregate the signal into multiple tributary signal streams, corresponding to the number of surface-emitting array elements 320, to further mitigate air/atmosphere transmission impairments. Furthermore, the implementation of controllable waveguides 324 serves to provide a non-mechanical adaptive steering and alignment control system that further increases the accuracy of such array-based FSO connections.

The systems and methods described herein thus advantageously expand upon the OIL/COIL innovations previously developed by the present inventors, and which are incorporated by reference herein. The present FSO techniques, for example, may be effectively implemented as cost-effective replacements for existing optical fiber/fiber cable plants, and/or as cost-effective alternatives to complex geographies or topologies where the deployment of additional fiber is cost-prohibitive (e.g., in rural deployment schemes) or space-limited (e.g., a DCI).

Additionally, in many optical access network implementations, a single-fiber topology is deployed. That is, both downstream and upstream transmission may occur over the same single strand of fiber (e.g., SMF). In the case of FSO transmission, both such directional transmissions are sent over the same FSO communication medium (e.g., air, space, atmosphere, etc.). The present embodiments are therefore particularly useful for such bidirectional applications, including full-duplex (FDX) simultaneous bidirectional coherent transmission schemes, in that the present systems and methods may advantageously operate agnostically to the direction of transmission. In this regard, such terms as "downstream" and "upstream" are relative, and merely indicate one transceiver as a reference point with respect to a different transceiver at the other end of the optical communication medium.

Accordingly, the architecture of array 300 described herein, by avoiding the need for conventional compensation hardware, may therefore be fabricated less expensive and more compact physical device in comparison with conventional FSO schemes and devices. The novel and advantageous all-optical design of array 300 thus further enables adaptable multi-wavelength emission with simplicity, reliability, and low cost. That is, because all child lasers 320 in array 300 are phase-synchronized and wavelength-locked to parent laser source 308, child lasers 320 remain agnostic to any changes to the frequency/wavelength of the parent signal. As the parent signal from parent laser source 308 changes, all child lasers 320 will change accordingly with the changes to the parent signal.

According to the present embodiments, a single parent laser may be effectively implemented to supply the parent source for a number of low-cost (e.g., FP) child lasers in a COIL-based system according to one or more of the following scenarios: (1) many phase-synchronized and wavelength-locked child lasers are configured to transmit the same high data rate signals, which enables redundancy and joint processing from the multiple signal copies; (2) many phase-synchronized and wavelength-locked child lasers transmit different low data rate signals from one another, which enables high tolerance of impairments and joint processing from the low-data rates of the multiple tributary signals, which may be combined for high capacity throughput; and/or (3) a hybrid configured for multiple clusters of child lasers, such that each cluster is enabled to transmit the same signal, thereby realizing an optimal balance between diversity and capacity of the optical network. For each scenario, respective receivers of the transmitting lasers may be configured to implement coherent detection for better receiver sensitivity. In all of these scenarios, each child laser is enabled to perform as both the transmitter laser source and a local oscillator source.

Systems and methods according to the preceding embodiments thus realize significant cost savings over conventional systems by distributing the relatively higher cost of the high-performance parent laser (e.g., an ECL) signal over a number of low-cost child lasers (e.g., FPs). For example, in the case where the parent laser is transmitting at +10 dBm optical power, a 20-dB budget may be implemented to locally split the high quality signal 16 ways (e.g., FIG. 3, above), or higher, and may further transmit the same parent laser signal to a remote site (i.e., receivers) with sufficient power budget. Since the cost of an FP laser is about two orders of magnitude lower than the cost of an ECL, the overall hardware cost of a single parent ECL is further reduced/distributed as the number of child lasers for the same network is increased.

The person of ordinary skill the art will further understand that the innovative OIL/COIL FSO principles are not limited to the architectural design described above with respect to FIG. 3, which is provided by way of example. Other optical-input/optical-output OIL/COIL-based architectural configurations may be realized without departing from the scope herein. One such alternative architectural configuration is described further below with respect to FIG. 4, which demonstrates a three-dimensional implementation of an injection-based coherent FSO source.

Figure 4:
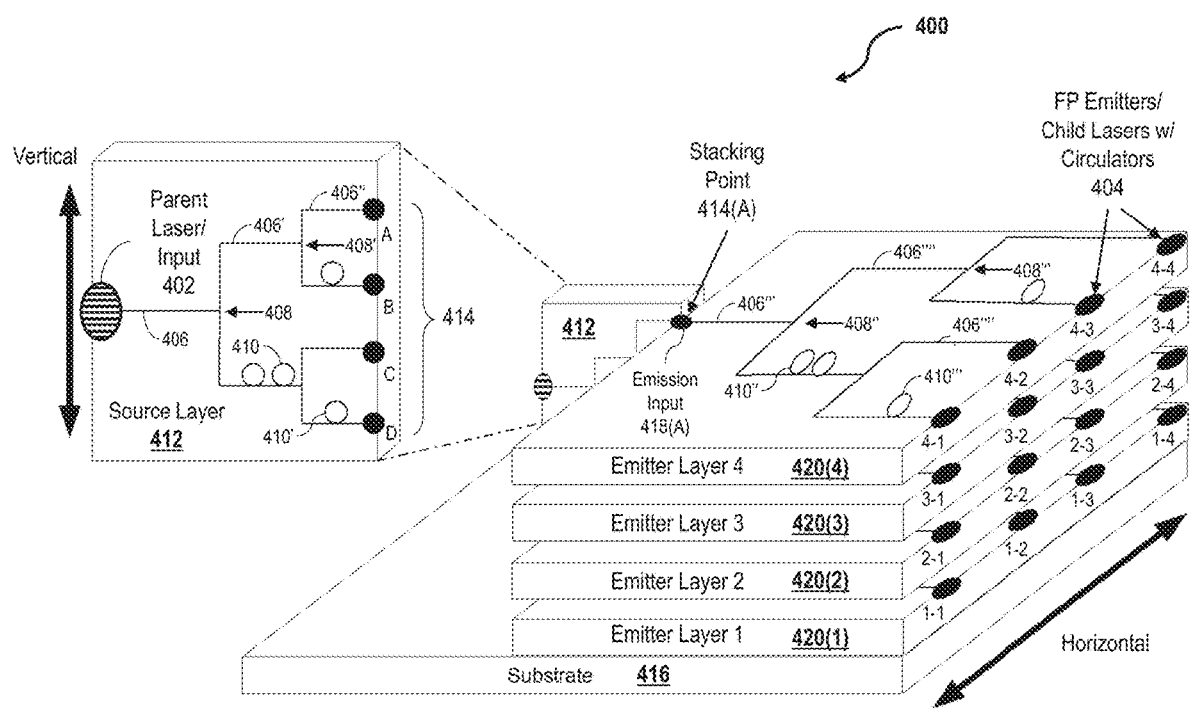
FIG. 4 is a schematic illustration depicting an exemplary optical injection locking laser array stack.

FIG. 4 is a schematic illustration depicting an exemplary OIL laser array stack 400. Array stack 400 is similar, in a number of aspects, to array 300, FIG. 3, and common elements therebetween are referred to using similar labels. For example, array stack 400 includes a single parent laser source 402 as an optical input to array stack 400, a plurality of child lasers 404 as optical outputs from array stack 400, and a plurality of optical distribution branches 406, optical splits 408, and controllable waveguides 410 disposed therebetween. Unless described herein to the contrary, these several elements may be considered to have similar structure and/or function to elements of array 300, FIG. 3, having the same labels.

Additionally, for ease of comparison with array 300, FIG. 3, array stack 400 is illustrated in an architectural configuration resulting in a similar 1:16 parent-to-child laser ratio, as well as a 4×4 output array of child lasers 404. The person of ordinary skill in the art, however, will understand that this particular configuration is provided by way of example, and not in a limiting sense. Other architectural configurations for array stack 400 may be realized, according to the principles described above and further below, without departing from the scope herein.

Array stack 400 structurally differs though, from array 300, FIG. 3. That is, instead of having all elements fabricated on a single planar layer of a substrate (e.g., substrate 306, FIG. 3), array stack 400 alternatively distributes a number of elements across several fabricated layers disposed in parallel with, or perpendicularly to, one another. In the exemplary embodiment depicted in FIG. 4, parent laser source 402 is fabricated on a source layer 412. Source layer 412 has a substantially similar topological configuration to waveguide/distribution portion 302 of array 300, FIG. 3, except that the several optical distribution branches 406 and optical splits 408 of source layer 412 lead to a plurality of stacking points 414 instead of respective splitters (e.g., splitters 316, FIG. 3).

Source layer 412 also differs from waveguide/distribution portion 302, in that source layer 412 is disposed vertically with respect to a horizontal plane of an underlying substrate 416. The person of ordinary skill the art will understand that terms such as "vertical" and "horizontal" are used for reference purposes only, and merely describe the relative disposition of source layer 412 perpendicular to substrate 416. For example, utilizing an arbitrary Cartesian coordinate system, substrate 416 may be thought to be disposed substantially parallel to the x-y plane, whereas source layer 412 may be thought to be disposed substantially perpendicularly to substrate 416, namely, in one of the x-z or y-z planes.

In the exemplary embodiment depicted in FIG. 4, each stacking point 414 of source layer 412 connects directly to an emission input 418 of a respective substantially planar emitter layer 420 formed on top of, and parallel to, substrate 416. In the exemplary embodiment, the number of emitter layers 420 (4, in this example) corresponds to a number of stacking points 414, and the respective emitter layers 420 may be successively formed on top of one another, and vertically spaced such that the respective emission input 418 of each emitter layer 420 aligns with a particular stacking point 414 of source layer 412. In some embodiments, additional substrate layers (not shown) may be fabricated between successive emitter layers 420 to control the physical spacing therebetween and resultant alignment with respective stacking points 414.

Array stack 400 thus represents an effective alternative solution to achieve a similar injection-locked output array of low-cost optical FP emitter child lasers 404 using a single parent laser input 402. This alternative configuration may be of particular value in applications where steerability is of greater concern. According to the innovative configuration of array stack 400, vertical steerability may be effectively controlled by the disposition of stacking points 414, and horizontal steerability may be controlled by the functioning of controllable waveguides 410", 410''' disposed within the respective emitter layers 420.

Array stack 400 may also provide a useful solution where it is more desirable to fabricate FP emitter child lasers in a linear array for an emitter layer (i.e., 1×2, 1×4, 1×8, 1×16, etc.), as opposed to a planar array of surface emitters having at least a 2×2 array configuration on the same layer. It should be noted though, that the output array of FP emitter child lasers according to array stack 400 will have a minimum 2×2 configuration. The unique construction aspects of array stack 400 enable additional versatility to the structural design approach. Nevertheless, and similar to array 300, FIG. 3, each injection-locked child laser 404 of array stack 400 demonstrates the high performance and full power transmission from parent laser source 402, with no significant gain lost from input to output.

Exemplary OIL/COIL applications for FSO transport are described above by way of example, and not in a limiting sense. Additional OIL implementations may be utilized instead of, or in addition to, the foregoing FSO embodiments without departing from the scope herein. Examples of such complementary OIL implementations are described in greater detail in U.S. Pat. No. 11,115,126, issued Sep. 7, 2021, in U.S. Pat. No. 10,965,393, issued Mar. 30, 2021, U.S. Pat. No. 10,623,104, issued Apr. 14, 2020, U.S. Pat. No. 10,944,478, issued Mar. 9, 2021, and in co-pending U.S. patent application Ser. No. 17/187,237, filed Feb. 26, 2021. The disclosures of all of these previous references are incorporated by reference herein in their entireties.

The systems and methods herein are described, by way of example and not in a limiting sense, with respect to an ECL for the parent laser source(s) and FP lasers as the child laser emitters. Other types of optical sources though, may be used for the respective parent and child lasers without departing from the scope herein. For example, a distributed feedback (DFB) laser may be utilized to provide a high-quality source signal. Similarly, other types of inexpensive optical emitters, such as LEDs and/or vertical-cavity surface-emitting lasers (VCSELs) may be implemented for injection-locking to the high-quality parent signal.

Furthermore, the multiple FSO OIL/COIL embodiments described herein provide additional utility for both coherent and non-coherent detection systems, as well as for both FDX and non-FDX optical networks or PONs, in both uplink and downlink transmissions, and for various modulations (e.g., QPSK, 16QAM, etc.). According to the present disclosure, the innovative OIL/COIL-based FSO arrays further enable their utilization as dual-polarization optical transmitters. The present systems and methods are thus particularly beneficial for longhaul and shortreach applications to significantly reduce the cost of electronic hardware, while also rendering the overall network system architecture more compact and versatile.

The present systems and methods therefore further improve upon existing solutions to the conventional OIL schemes created by the present inventors. The present embodiments may therefore be cost-effectively implemented within coherent DWDM-PON system architectures for access networks in a manner similar to such previous solutions, as an alternative to the physical plant of optical fiber as an optical communication medium.

The present systems and methods thus achieve more efficient transmission of wavelengths through FSO media, thereby increasing the capacity of transmitted data, but at lower power and hardware cost, an increased receiver sensitivity in coherent deployments, and with a reduction in dispersion, and the need for DSP compensation and error correction. The person of ordinary skill in the art will understand that the principles described herein are particularly applicable to networks employing FSO transmission or other wireless technologies, including data centers and/or the DCI paradigm, namely, for both intra- and inter-data center connections.

Exemplary embodiments of OIL-based FSO communication systems and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other optical networks utilizing fiber and/or coaxial transmission at the end user stage.

All Optical (Fiber/FSO) End-to-End Systems

Conventional FSO systems are typically decoupled from their respective feed network(s) or feed link(s). A conventional end-to-end FSO system, for example, terminates an input fiber link at the FSO transmitter, and then utilizes an electrical output of the optical link to drive the FSO system carrying the desired payload. After the electrically-driven FSO signal traverses free space, an FSO receiver converts the received optical information back into the electrical domain, thereby driving another, different optical link to carry the converted signal to its final destination. As described further below, the present systems and methods leveraging coherent optics to significantly avoid the inefficiency of the conventional techniques by developing innovative techniques for providing end-to-end signal transport entirely within the optical domain. By removing the need for electrical conversion, a significantly more compact, lower power, and lower complexity system may be realized.

As described above, a high quality Laser source is one of the highest-cost hardware elements in a coherent transceiver, and particularly for a number of FSO implementations. The embodiments described above demonstrate innovative systems and methods to utilize multiple low-cost child lasers for an FSO link, using OIL technologies, to significantly reduce the cost of the transceiver for FSO coherent links by avoiding the higher-cost and higher-complexity commercially available opto-electronic subsystems that perform multiple electrical-to-optical (E/O) and optical-to-electrical (O/E) conversions.

However, optical signals transported over FSO are known to sometimes vary randomly with time due to the effect of atmospheric turbulence on the propagating optical signals before reaching each respective receiver aperture. The following embodiments mitigate such air/FSO transmission impairments by disaggregating the optical signal into multiple tributary signal streams from a number of corresponding array elements from the transmitting transceiver (e.g., FIGS. 3-4, above). Using OIL-based transmission techniques, since all of the laser signals transmitted from the respective array elements are injection-locked to the same parent laser, the multiple received signals may be jointly processed, after FSO propagation, to recover the original transmitted signal. The overall accuracy of such array-based FSO communications is even further improved by the inclusion of additional adaptive steering and alignment control.

Hybrid Coherent FSO/Wireless Communication System

As described above, the ever-increasing demand for data and the increasingly-congested radio frequency spectrum renders the present FSO solutions of particular applicability in scenarios where fiber is prohibitively expensive or difficult to install. Optical transceivers of FSO communication systems though, should be in line of sight of one another, across the free space/air transmission medium therebetween, for successful transmission of their optical signals. Conventional FSO systems, for example, typically include at least one optical transceiver at either end of the transmission medium to provide bidirectional capability, and are known to transmit at gigabits per second (Gbps) rates over several kilometers (km). FSO technology is expected to be a significant part of future 6G systems, including light detection and ranging (LiDAR), ultra-high speed fixed wireless, and satellite communications.

However, as described above, FSO channel propagation is subject to several technical challenges, including (a) atmospheric attenuations and turbulence, and (b) divergence over long distances. The following embodiments provide innovative solutions to these challenges, and thus significantly improve channel transmission performance over optical channels, and particularly those used for 100G FSO capacity over long distance.

The present systems and methods provide innovative processes and architectures for arraying multiple transmitters and receivers to reduce the probability of deep fades in the FSO transmission, and thereby improve the overall emission and detection efficiency thereof. In exemplary embodiments, the additional implementation of coherent technology to the FSO system achieves even further tolerance to background noise, and also improved spatial and frequency selectivity, by leveraging the inherent coherent gain realized when the spatial field of the received signal matches that of the local oscillator (LO).

Figure 5:
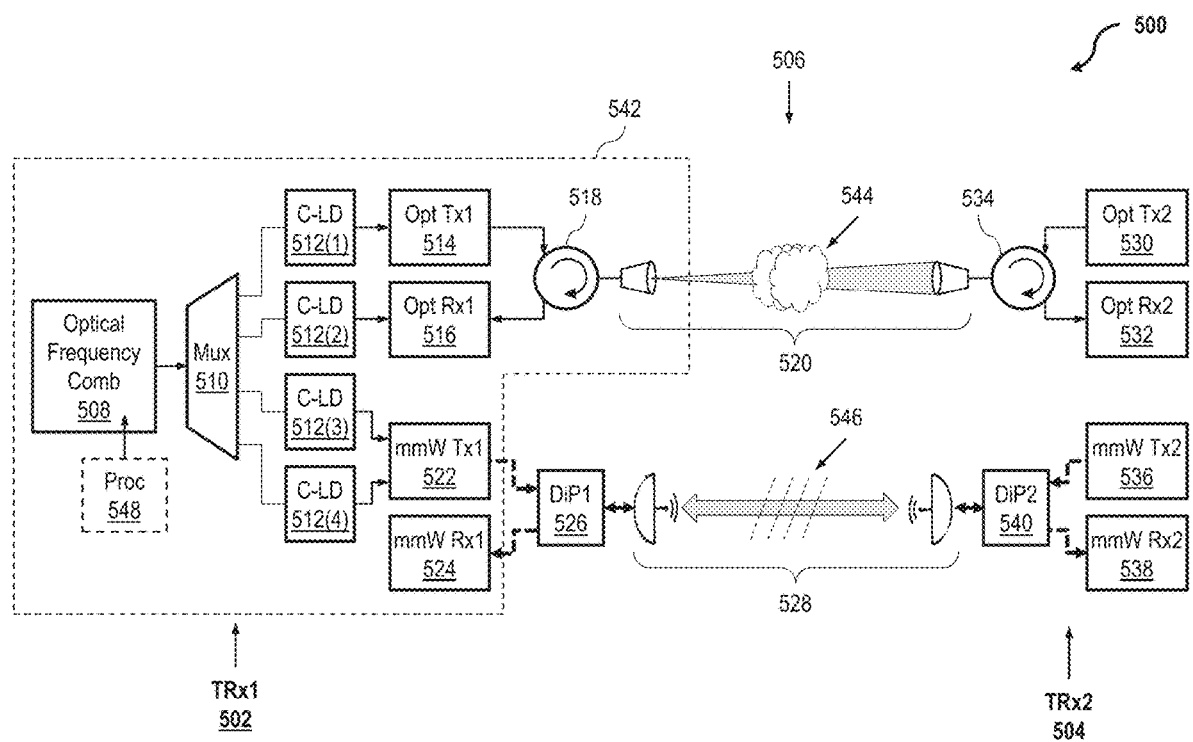
FIG. 5 is a schematic illustration depicting an exemplary hybrid bidirectional communication system.

FIG. 5 is a schematic illustration depicting an exemplary hybrid communication system 500. In an embodiment, system 500 includes a first transceiver end 502 and a downstream transceiver end 504 configured for communication therebetween over a wireless/free space channel 506. In the exemplary embodiment, channel 506 is capable of allowing transport of optical and/or millimeter-wave (mmW)/microwave signals.

In an exemplary embodiment, first transceiver end 502 includes an optical frequency comb source 508 (e.g., an ECL) configured to generate a parent signal including a plurality of spaced optical carriers. A multiplexer 510 separates the spaced optical carriers to a plurality of child lasers 512 that are injection-locked to a frequency of comb source 508. In the embodiment depicted in FIG. 5, four child lasers 512 are shown by way of example, for ease of explanation, and not in a limiting sense. More or fewer child lasers 512 may be implemented without departing from the scope herein.

In an embodiment, the laser signal from first child laser 512(1) is used as the laser source for a first optical transmitter 514, and the signal from second child laser 512(2) is used as the laser source for a first optical receiver 516, that is, one child laser 512 for each respective optical transmitter or receiver. In some embodiments, system 500 operates in full duplex (FDX) bidirectional mode. In such cases, first optical transmitter 514 and first optical receiver 516 may each be in communication with a first optical circulator 518 configured to transmit and receive optical transmissions over the same wavelength and an FSO communication link 520.

In the exemplary embodiment, first transceiver end 502 further includes a first mmW transmitter 522 and a first mmW receiver 524. In the embodiment depicted in FIG. 5, the respective laser signals from both of third child laser 512(3) and fourth child laser 512(4) are provided to first mmW transmitter 522 so that the two respective optical signals thereof may beat together at first mmW transmitter 522 to generate a downlink (with respect to first transceiver end 502) mmW signal from the optical domain to a first diplexer 526 for downstream transmission over a mmW communication link 528. In a similar manner, upstream mmW signals from mmW communication link 528 are delivered to first mmW receiver 524 from first diplexer 526. In this example, first mmW receiver 524 need not utilize an individual child laser 512 to process electrical signals (bold dashed lines) received from first diplexer 526. In some cases, one of the respective signals to first mmW transmitter 522 from third and fourth child lasers 512(3), 512(4) is modulated and one is unmodulated (e.g., to avoid dispersion). In other cases, both such signals may be modulated.

Further to the exemplary embodiment, second transceiver end 504 includes a second optical transmitter 530 and a second optical receiver 532. Optionally, in the case of FDX operation, both of second optical transmitter 530 and second optical receiver 532 are in communication with a second optical circulator 534 configured to transmit and receive optical transmissions over FSO communication link 520. In some embodiments, e.g., when FDX operation is not implemented, FSO communication link 520 may be two (or more) separate FSO links; one FSO link between first optical transmitter 514 and second optical receiver 532, and another separate FSO link between second optical transmitter 530 and first optical receiver 516. That is, in such cases, first and second optical circulators 518, 534 may not be needed. In an exemplary embodiment, first optical transmitter 514 and first optical receiver 516 may utilize the same wavelength (e.g., a shared single child laser 512), and particularly where both of first and second optical circulators 518, 534 are implemented.

In this embodiment, second transceiver end 504 further includes a second mmW transmitter 536 and a second mmW receiver 538 in communication with a second diplexer 540 configured to transmit and receive mmW transmissions over mmW communication link 528. It may be noted that, according to the exemplary configuration of system 500, except for the electrical signals to and from first diplexer 526, all of the several elements within system 500 may be disposed in an all-optical shared architecture 542, which is particularly advantageous with respect to the exemplary printed optical structures described above.

It should be further noted that embodiments according to system 500 represents more than simply the mere combination of FSO technology with mmW technology. Optical and mmW transmissions, for example, are known to have different respective sensitivities. FSO transport, for example, may suffer high attenuation due to atmospheric conditions 544 such as fog, whereas mmW transport (e.g., RF signals) may be strongly affected by atmospheric conditions 546 such as rain. Indeed, the different absorption and/or reflection characteristics resulting from various types of moisture—including, without limitation, snowflakes, dry snow, wet snow, ice crystals, sleet, haze, fog, clouds, rain, mist, drizzle, smog, water vapor, etc. —along the propagation path may dynamically affect signal propagation along either or both of the FSO and mmW links 520, 528.

For example, for mmW link 528, electromagnetic wave attenuation due to rain is expected to be one of the primary scattering and absorption loss components, and particularly at RF frequencies above 10 GHz. When the wavelength of the mmW signal is large with respect to the diameter of a raindrop, scattering is predominant, whereas, when the mmW wavelength is small relative to the raindrop, diameter, absorption attenuation due is predominant. It is conventionally known that water molecules are dipoles and, because a raindrop's dipoles will see the same time variation as the electromagnetic waves, the raindrop dipoles act as "low-directivity antennas," which re-radiates the electromagnetic wave energy of the mmW signal. Since rainfall does not necessarily include raindrops of consistent size over time, hybrid system 500 is configured to dynamically respond to the real-time effect of the atmospheric conditions on the propagation path of mmW link 528.

Cloud and fog attenuation, on the other hand, is generally a function of frequency and temperature. Attenuation is considered negligible at 10 GHz, below 2 dB/km at 35 GHz (e.g., 30-meter visibility), and 3-10 dB/km at 94 GHz. Hybrid system 500 though, may operate within the 1 GHz-300 THz range, with signal spacing of up to 1 GHz. A particular advantage of integrating mmW transception with optical transception is the ability to generate optimum mmW signal frequencies through the intelligent wavelength selection by processor 548 to first mmW transmitter 522. The generated mmW signal from first mmW transmitter 522 may be based on the spacing between the wavelengths from third and fourth child lasers 512(3), 512(4), as opposed to the frequency of the wavelengths themselves. In this manner, processor 548 and comb source 508 may cooperate to enable the generation of mmW signals for mmW link 528 that are less subject (e.g., below 10 Ghz) to atmospheric RF attenuation.

Alternatively, or additionally, the optical wavelengths from comb source 508 may selected such that known atmospheric attenuations or degradations may be avoided, including without limitation, those resulting from strong water vapor absorption bands (e.g., 2500 nm, 1950 nm, 1450 nm), weak water vapor absorption bands (e.g., 1200 nm, 970 nm), and/or bands within or near the infrared spectrum (e.g., 930 nm, 820 nm, 730 nm). Similar frequency agility techniques and principles may be advantageously applied to the respective transmitters 514, 522 to avoid one or more of the other atmospheric conditions (e.g., fog, clouds, ice, snow, etc.) described above, either in a predetermined manner, or dynamically based on feedback from the respective receivers 516, 524.

According to hybrid system 500 though, a processor 548 of first transceiver end 502 may be configured to dynamically determine, e.g., based on feedback from either or both of receivers 516, 524, that moisture absorption/reflection is occurring, and then cause optical frequency comb source 508 to adjust or switch the frequency of a particular wavelength feeding one or both of transmitters 514, 522 to avoid the resulting signal attenuation caused by the absorption or reflection. Processor 548 may, for example, be a separate unit from optical frequency comb source 508, or alternatively, may be integrated within the architecture of comb source 508. In some embodiments, processor 548 may determine that attenuation on one of the transport links 520, 528 is significant enough to control the delivery of optical wavelengths within architecture 542 to switch the signals transported on the affected link to the respective transmitter(s) communicating over the unaffected link.

Accordingly, in the exemplary embodiment, optical frequency comb source 508 is further configured to control the selection of optical signals into the respective optical and mmW transmitters/receivers as a single integrated optical system. That is, unlike conventional mmW/microwave communication systems, the signals input to first mmW transmitter 522 are all-optical, and the beating of these signals together enables first mmW transmitter 522 to output an electrical/RF signal for mmW link 528 that is fully coordinated with the optical signals transported over FSO link 520.

In other words, the implementation of optical frequency comb source 508 together with a plurality of injection-locked child lasers 512 enables optical mmW generation using almost entirely low-cost optical sources for both of mmW link 528 and 520 coherent FSO link with. Accordingly, mmW link 528 of hybrid system 500 provides greater advantages then simple system redundancy, since the respective FSO and mmW transmissions may be independent of one another. In this scenario, the same optical network (e.g., all-optical shared architecture 542) is effectively enabled to communicate over two separate and independent communication channels to increase the overall system capacity, i.e., FSO link 520 and mmW link 528. A joint FSO/mmW architecture according to hybrid system 500 joint system thus enables an ultra-reliable and stable link under various different weather conditions and geographical environments.

Exemplary hybrid system 500 is described herein with respect to an FSO communication link between the opposing first and second transceiver ends 502, 504. The person of ordinary skill in the art though, will understand that the innovative principles herein may be applied to hybrid optical/mmW systems utilizing wired optical links between respective transceiver ends, including without limitation, optical fiber and/or hollow core fiber networks, and/or optical networks implementing a mix of fiber and FSO connections. The person of ordinary skill in the art will further understand that the mmW technologies described herein include, without limitation, signals generated within the mmW, microwave, RF, and sub-THz bands (e.g., 6G communications).

In an exemplary embodiment, the respective optical signals described with respect to FIG. 5 implement coherent technology; however, the optical signals herein may be generated according to other optical technologies, e.g., intensity-modulation and direct-detection (IM-DD), etc. Coherent optical technologies though, are expected to achieve superior performance, while experiencing fewer reflections than other optical technologies. Using coherent technologies, for example, there is no need for any conversion into the electrical domain, except for the eventual electrical signals generated—using only optical sources—by first mmW transmitter 522. The generation of mmW signals using photonic technology is described in greater detail in co-pending U.S. Provisional application Ser. No. 18/096,793, filed Jan. 13, 2023, the subject matter of which is incorporated by reference in its entirety.

The exemplary embodiment depicted in FIG. 5 thus demonstrates how significant polarization distortion robustness may be realized through simplified self-coherent transceivers in an FSO system. For example, in fiber optical communications, the intrinsic birefringence of silicon dioxide causes the state of polarization (SoP) to continually fluctuate, thereby making detection at the optical receiver difficult. In contrast, in an FSO system, for a highly coherent light source (e.g., an ECL), the depolarization property of the atmospheric channel is very weak, and therefore the SoP may be maintained in a much more stable manner, and even over considerably longer transmission distances. In an exemplary embodiment, implementation of polarization shift keying may thus further improve the reliability of FSO/mmW hybrid system 500.

Accordingly, by leveraging such polarization stability properties, the overall architecture of a coherent optical transceiver for an FSO link may be significantly simplified, as described further below with respect to FIG. 6. For ease of explanation, the embodiment depicted in FIG. 6 is explained only with respect to FSO transport, but is not exclusive of the hybrid FSO/mmW embodiments described above.

Figure 6:
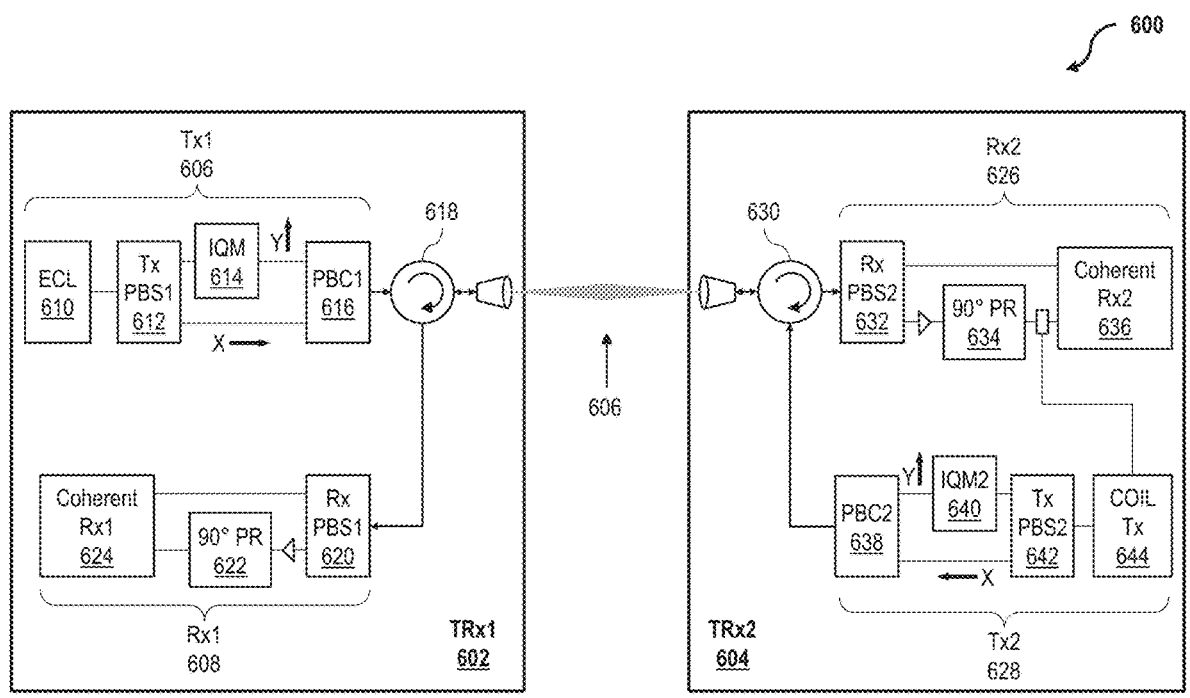
FIG. 6 is a schematic illustration depicting a self-beating coherent free space optics system for a single wavelength.

FIG. 6 is a schematic illustration depicting a self-beating coherent FSO system 600 for a single wavelength. In an exemplary embodiment, system 600 includes a first transceiver 602 configured for optical communication with a second transceiver 604 over an optical communication channel 606. In the exemplary embodiment depicted in FIG. 6, optical communication channel 606 may be an air channel including the polarization stability features described immediately above.

In an exemplary embodiment, first transceiver 602 includes a first transmitting portion 606 and first receiving portion 608. First transmitting portion 606 includes a primary laser source 610 (e.g., an ECL or an injection-locked FP) and a first transmitter polarization beam splitter (PBS) 612 configured to split the optical signal from primary laser source 610 into at least two polarizations, e.g., an X-polarization and a Y-polarization. One of the two polarizations (the Y-polarization, in this example) is delivered to a first in-phase (I) and quadrature (Q) modulator (IQM) 614, and the other of the two polarizations (the X-polarization, in this example) is combined with an output of first IQM 614 at a first polarization beam combiner 616, and the combined dual-polarization signal thereof is then provided to a first optical coupler 618 for optical transport over optical communication channel 606.

In the exemplary embodiment, first receiver portion 608 includes a first receiver PBS 620 configured to receive, through first optical circulator 618, optical signals received from second transceiver 604 over optical communication channel 606. First receiver PBS 620 separates the respective X- and Y-polarizations of such received optical signals (e.g., also dual-polarization signals), and feeds one of the polarized signals to a first 90-degree polarization rotator (PR) 622 to align with the polarization direction of the other channel after output from first receiver PBS 620, and a first coherent receiver 624 processes the other polarized signal and an output of first PR 622.

In an exemplary embodiment, second transceiver 604 is structured in a substantially similar manner to first transceiver 602, and includes a second receiving portion 626, a second transmitting portion 628, and a second optical circulator 630. Second receiving portion 626 may, for example, be substantially similar to first receiving portion 608, and includes a second receiver PBS 632, a second 90-degree PR 634, and a second coherent receiver 636. In the exemplary embodiment, second transmitting portion 628 may also be substantially similar to first transmitting portion 606, and includes a second PBC 638, a second IQM 640, and a second transmitter PBS 642. In this embodiment, second transmitting portion 628 further includes a child laser source 644 utilizing COIL (e.g., an FP) with respect to primary laser source 610 (e.g., in the case where primary laser source 610 is an ECL, or to the same ECL functioning as a primary source to both child lasers 610, 644), through operable communication with the output from second 90-degree PR 634 (e.g., the unmodulated signal polarization from first transmitting portion 606).

In the exemplary embodiment depicted in FIG. 6, for ease of explanation, system 600 is shown to represent a single-wavelength P2P FSO link. In exemplary operation of system 600, light from primary laser source 610 is initially split by first transmitter PBS 612 into X- and Y-polarizations. In an exemplary embodiment, one of the light polarizations (the X-polarization, in this example) is unmodulated, leaving that polarized light signal effectively "empty" for alternative use. The other light polarization (the Y-polarization, in this example) is modulated by first IQM 614 with a vector single-carrier data. The two polarizations, i.e., one modulated and one unmodulated, are then merged by first PBC 616 prior to collimation and emission over the air of optical communication channel 606. The respective modulated and unmodulated signals thus share the same frequency, but at different relative polarizations. At the site of first receiver portion 608, first receiver PBS 620 similarly functions to separate the X- and Y-polarizations for processing by first coherent receiver 624.

In the exemplary embodiment, the air of optical communication channel 606 is considered to have a very minor impact on the respective polarization states of the highly coherent light provided by primary laser source 610. Therefore, SoP changes or fluctuations are expected to be substantially negligible for transmissions over relatively short or medium distances, and when air turbulence is relatively stable (which is especially the case for indoor communication systems). Given such stability between the two polarizations, the polarization direction of the light on the X-polarization tributary may then be easily rotated by 90 degrees to be aligned with the Y-polarization signal light (or vice versa). The modulated polarization may then be used as the signal, and the unmodulated polarization has the LO, and the signal and LO lights may be transmitted together to the opposing transceiver (e.g., second transceiver 604) in the downlink.

In the uplink direction, at second transceiver 604, part of the LO light (i.e., the unmodulated polarization) is tapped, at second 90-degree PR 634, for use as a seed light to injection-lock an inexpensive child laser (e.g., an FP) serving as child laser source 644 of second transmitting portion 628 for the uplink signals. Thus, in the uplink transmission, second transmitting portion 628 functions similarly to the downlink transmission from first transmitting portion 606, except that an ECL that might be used for primary laser source 610 is replaced by COIL source 644, thereby eliminating the need for at least one costly laser at second transceiver 604. As described above, in the case where an optical frequency comb is used to generate multiple optical carriers from a single, high-quality ECL source, another costly laser source may also be eliminated at first transceiver 602, such as in the case where first transceiver 602 represents an array of individual coherent transceivers (e.g., a P2MP system) or wavelengths (described further below with respect to FIG. 7).

Accordingly, by utilizing the polarization stability of FSO optical communication channel 606, in coordination with COIL at one or more of the transmitting portions of the several transceivers of system 600, systems and methods according to the present techniques are further enabled to eliminate the need for separate LOs at both sides of the FSO link. Architectures according to system 600 therefore represent significant simplifications, and thus improvements, with respect to conventional systems in at least two aspects. In a first aspect, at the transmitter portion of one transceiver, I and Q signals are modulated on one light polarization, and the other polarization is left unmodulated to provide a high-power optical pure carrier. At the receiver portion of an opposing transceiver, and LO signal may be easily extracted from the unmodulated pure optical carrier, thereby eliminating the need for an additional laser source, and particularly an ECL, as the LO source.

In a second aspect, since the lights signals on the two SoPs are expected to suffer from the same phase noise and carrier frequency offset (CFO) degradations, the two polarized signals, whether or not affected by such degradations, will still form a highly coherent optical tone pair. When the light from this coherent optical tone pair beats with each other, the phase noise and CFO will be canceled out, leaving only the desired modulated signal to remain. Thus, since both polarizations use the same wavelength, homodyne operation is effectively implemented, as opposed to intradyne operation. According to this self-beating technique, DSP at the respective receiving portions is greatly simplified, thereby rendering the complexity of the signal recovery for this coherent optical embodiment roughly equivalent to the signal recovery processing needed for an IM-DD scheme, which was heretofore considered substantially less complex than that needed for a coherent scheme.

Multi-Wavelength Coherent FSO

As described above, the present systems and methods are not limited to the P2P single-wavelength FSO link embodiment illustrated for system 600, FIG. 6. As described further below with respect to FIG. 7, the innovative principles and techniques described herein may also be applied to multi-wavelength transceiver designs, such as those implementing wavelength-division multiplexing (WDM) to support ultra-high-speed wireless transport and access services. Such potential multi-wavelength scenarios include, without limitation, DCIs among respective server blades, and mobile backhaul for rural areas where wired access may be difficult, or simply may not be available.

Figure 7:
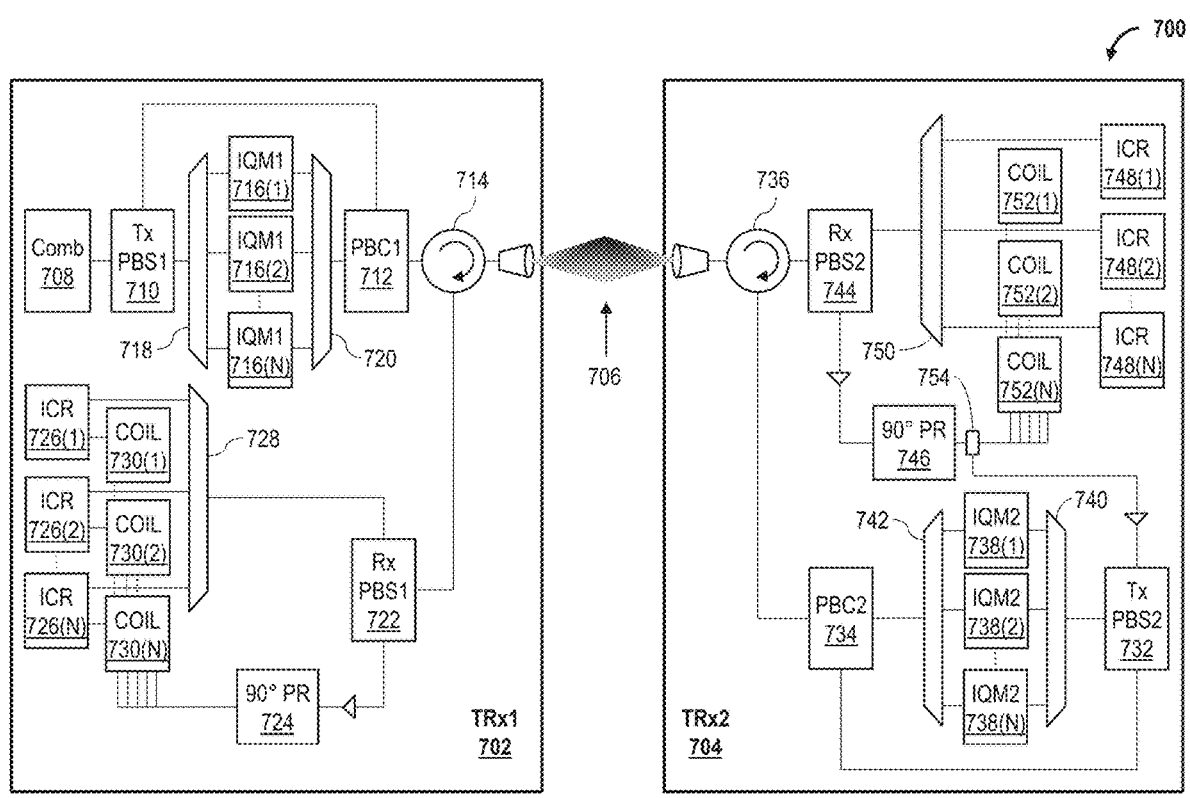
FIG. 7 is a schematic illustration depicting a self-beating coherent free space optics system for multiple wavelength operation.

FIG. 7 is a schematic illustration depicting a self-beating coherent FSO system 700 for multiple wavelength operation. In an exemplary embodiment, multi-wavelength system 700 is similar, in many structural and functional aspects, to single-wavelength system 600, FIG. 6, and includes a first transceiver 702 in operable communication with a second transceiver 704 over an optical communication channel 706. System 700 differs though, from system 600, in that first transceiver 702 includes an optical frequency comb generator 708 configured to generate multiple optical wavelengths for wavelength-division multiplexing (WDM), in contrast to single-wavelength primary signal source 608, FIG. 6.

In the exemplary embodiment, first transceiver 702 also includes, similarly to first transceiver 602, FIG. 6, a first transmitter PBS 710, a first PBC 712, and a first optical circulator 714. Different though, from first transceiver 602 of system 600, instead of single first IQM 614, first transceiver 702 includes a plurality (i.e., 1–N) of first IQMs 716 disposed between a first transmitter demultiplexer 718 and a first transmitter multiplexer 720, where each IQM 716 is configured for a respective wavelength generated from optical frequency comb generator 708.

First transceiver 702 is also similar, in several aspects, to first transceiver 602 with respect to receiver functionality, and includes a first receiver PBS 722 and a first 90-degree PR 724. First transceiver 702 further differs though, from first transceiver 602, in that, instead of single first coherent receiver 624, first transceiver 702 includes a plurality (i.e., 1–N) of first integrated coherent receivers (ICRs) 726, each configured to receive, through a first receiver demultiplexer 728, a modulated polarization of a dual-polarization signal from second transceiver 704. First transceiver 702 further includes a plurality (i.e., 1–N) of first child laser sources 730 injection-locked to a respective wavelength originally generated by optical frequency comb source 708.

Operationally, first transceiver 702 functions in a substantially similar manner to first transceiver 602, FIG. 6. That is, even though multiple wavelengths are generated by optical frequency comb source 708, for each such wavelength, one polarization of each wavelength may be modulated by a respective first IQM 716, while the other polarization of that wavelength remains "empty" to function as a pure high power signal for use as an LO source in the downlink, and/or for modulation in the uplink.

The overall structure and functionality of second transceiver 704 is thus substantially similar to that of first transceiver 702, except that second transceiver 704 not implement its own optical frequency comb source to implement COIL for either transmitting or receiving. Thus, second transceiver 704 similarly includes a second transmitter PBS 732, a second PBC 734, a second optical circulator 736, a plurality (i.e., 1–N) of second IQMs 738 disposed between a second transmitter demultiplexer 740 and a second transmitter multiplexer 742, a second receiver PBS 744, a second 90-degree PR 746, a plurality (i.e., 1–N) of second ICRs 748 connected to a second receiver demultiplexer 750, and a plurality (i.e., 1–N) of second child laser sources 752 injection-locked to a respective wavelength from optical frequency comb source 708. In the exemplary embodiment, a portion of the respective unmodulated signals output from second 90-degree PR 746 is fed to second transmitter PBS 732 for use as seed signals.

Thus, according to the innovative architecture of system 700, a the single-wavelength ECL (e.g., primary signal source 608, FIG. 6) at first transceiver 702 may be advantageously substituted with an optical comb source (e.g., comb source 708) to simultaneously provide multiple respective light sources to a group of IQMs (e.g., first IQMs 716) each configured to respectively operate on the different wavelengths that the multiple light sources. Similar to the single-wavelength embodiment though, one polarization for each wavelength from the comb source is not modulated, and these unmodulated pure wavelengths may then be used as optical LO sources at the respective coherent receivers (e.g., second ICRs 748) at the opposing transceiver (e.g., second transceiver 704).

At second transceiver 704, the remaining structure and functionality is substantially the same as that from first transceiver 702, except that second transceiver 704 may further include a passive splitter 754 to feed the optical seeds for the LOs used in the uplink transmissions. Both transceivers 702, 704 may thus further implement COIL to match and selectively amplify the respective LO seeds at their corresponding wavelengths. In some embodiments, additional optical amplification may be implemented for uplink transmission by second transceiver 704 in order to boost the power of the unmodulated comb frequencies before they are modulated with uplink signals by second IQMs 738 and transmitted back to first transceiver 702. In at least one embodiment, since data multiplexing for different polarizations is implemented by system 700, it may be further desirable to utilize polarization-maintaining fiber (not shown) in either or both of transceivers 702, 704.

Accordingly, similar to the single-wavelength embodiment described above with respect to FIG. 6, in the multi-wavelength embodiment of system 700, since each optical carrier pair of the respective multiple wavelengths is highly coherent on different polarizations, each pair may easily propagate through the same wireless channel and experience the same potential phase noise and CFO degradations as the other polarization of the same pair. Such phase noise and/or CFO degradations will then be automatically canceled out when the two polarizations on the same wavelength beat with each other (i.e., both polarizations experiencing the same effects from the same propagation path), thereby significantly reducing the influence of phase noise, and without the need for the complex carrier phase estimation and CFO compensation required in conventional coherent systems.

Moreover, since the phase noise is suppressed by the self-beating of the modulated/unmodulated polarizations of the same wavelength, the clock of each signals may also be more easily recovered. Additionally, the self-beating techniques of the present coherent FSO systems further enable the implementation of powerful training-based signal equalization to further improve the DSP performance, thereby further reducing the DSP complexity, and thus also the cost of the DSP chip. According to the present techniques, and may be noted that, since one polarization of each dual-polarization wavelength remains unmodulated to serve as the optical LO, the overall spectral efficiency of the bidirectional link is approximately half of that realized by conventional coherent links. However, systems and methods according to the present techniques still achieve approximately double the spectral efficiency realized by conventional IM-DD system, and at the significantly higher receiver sensitivities known to coherent technologies.

Furthermore, the present systems and methods are demonstrated above to significantly simplify both the architecture and the needed DSP, thereby providing advantageous cost reductions in comparison to conventional coherent systems, and more so in the case where a comb-based WDM system is implemented. The present embodiments thus demonstrate particularly advantageous improvements with respect to future indoor, ultra-high-speed broad access networks and DCI communication systems. The present systems and methods further enable improved scalability capabilities, such that the number of WDM channels may be increased or dynamically controlled to further enhance the availability and reliability of the FSO link.

As described above with respect to FIG. 5, the improved FSO techniques described herein may be integrated with mmW transmission to both increase the reliability of the FSO link, and/or effectively expand upon the spectral efficiency of the FSO link by adding an additional mmW link coordinating with the same optical frequency comb source used for the FSO link. By themselves, mmW radio devices are known to sustain gigabit bandwidths over hundreds of meters, but with the proliferation of such devices, the resulting interference is likely to degrade their viability operating solely within the mmW paradigm. However, by integrating mmW technologies with coherent FSO technologies in a hybrid system, as described above, such hybrid systems advantageously provide fiber-like optical transmission capacity, reliability, and long ranges to the mmW operation. Additionally, the FSO/mmW integration principles described herein further enable joint processing by heterogeneous network links, such that feedback from receivers to their respective transmitters may be used to dynamically coordinate the link selection (i.e., FSO or mmW) of the hybrid system.

The FSO and hybrid FSO/mmW techniques described herein are thus fully suited to additionally implement COIL at multiple child lasers from a single parent source. Through injection locking, the child laser is enabled to closely adopt the optical frequency and linewidth characteristics of the parent laser source, which may then be shared between all of the multiple child lasers. Such techniques are particularly advantageous in the case of systems having a large number of synchronized optical sources. The COIL techniques described herein significantly lower the overall system cost through straightforward scalability, while further enabling high-quality coherent optical systems utilizing multiple signal copies for redundancy and joint processing.

In exemplary embodiments, coherent FSO transceivers according to the present systems and methods realize a significantly simplified design, in comparison with conventional coherent transceivers. These is simplified coherent transceiver design principles are particularly applicable to FSO-specific applications, due to the improved capability to significantly mitigate channel propagation impairments common to free space transmission and atmospheric channel conditions. Such simplified coherent FSO transceiver designs are particularly applicable, for example, for implementations such as FSO satellite crosslinks, where mitigation of channel impairments will significantly improve global broadband Internet access.

Exemplary embodiments of OIL-based FSO communication systems and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other optical networks utilizing fiber and/or coaxial transmission at the end user stage.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A hybrid optical transceiver, comprising:
   an optical frequency comb source configured to generate a plurality of spaced optical wavelengths;
   a plurality of child laser emitters, wherein each child laser emitter of the plurality of child laser emitters is injection-locked to a particular optical wavelength of the plurality of spaced optical wavelengths;
   a first transmitter configured to (i) receive a first emitted wavelength from a first child laser of the plurality of child lasers, and (ii) output a first modulated optical signal;
   a second transmitter configured to (i) receive a second emitted wavelength from a second child laser of the plurality of child lasers and a third emitted wavelength from a third child laser of the plurality of child lasers, and (ii) generate a first modulated electrical signal from beating the second emitted wavelength with the third emitted wavelength; and
   an electrical output portion configured to deliver the first modulated electrical signal to a wireless communication link, wherein the first modulated electrical signal is a millimeter-wave signal.

2. The optical transceiver of claim 1, further comprising an optical output portion configured to deliver the first modulated optical signal to an optical transport medium.

3. The optical transceiver of claim 2, wherein the optical transport medium is a free space optical link.

4. The optical transceiver of claim 2, wherein the optical output portion includes an optical circulator.

5. The optical transceiver of claim 4, further comprising an optical receiver configured to receive a second modulated optical signal sent from a remote transceiver over the optical transport medium.

6. The optical transceiver of claim 5, wherein the optical receiver includes a fourth child laser configured to generate a fourth emitted wavelength.

7. The optical transceiver of claim 6, wherein the fourth emitted wavelength is the first emitted wavelength.

8. The optical transceiver of claim 1, wherein the wireless communication link includes a first diplexer disposed proximate the optical transceiver.

9. The optical transceiver of claim 8, further comprising an electrical receiver configured to receive a second modulated electrical signal sent from a remote transceiver to the first diplexer over the wireless communication link.

10. The optical transceiver of claim 1, further comprising a processor configured to selectively provide the plurality of spaced optical wavelengths to one or more of the first, second, and third child lasers.

11. The optical transceiver of claim 10, wherein the processor is integrated with the optical frequency comb source.

12. The optical transceiver of claim 1, wherein the plurality of child lasers includes a plurality of Fabry Perot (FP) laser diodes, respectively.

* * * * *